US012775508B2

(12) United States Patent
Zhang et al.

(10) Patent No.: US 12,775,508 B2
(45) Date of Patent: Oct. 27, 2026

(54) DYNAMIC COMPUTE COMPOSITION WITH WORKLOAD REDISTRIBUTION AMONG MULTIPLE COMPOSABLE RESOURCES OF COMPOSABLE SYSTEM

(71) Applicant: Lenovo (Beijing) Limited, Beijing (CN)

(72) Inventors: Caihong Zhang, Shanghai (CN); Fred Allison Bower, III, Durham, NC (US)

(73) Assignee: LENOVO (BEIJING) LIMITED, Beijing (CN)

( * ) Notice: Subject to any disclaimer, the term of this patent is extended or adjusted under 35 U.S.C. 154(b) by 603 days.

(21) Appl. No.: 18/347,164

(22) Filed: Jul. 5, 2023

(65) Prior Publication Data

US 2024/0311210 A1 Sep. 19, 2024

(30) Foreign Application Priority Data

Mar. 14, 2023 (CN) ........................ 202310266536.7

(51) Int. Cl.
*G06F 9/50* (2006.01)
*H05K 7/20* (2006.01)

(52) U.S. Cl.
CPC ............ *G06F 9/5094* (2013.01); *G06F 9/505* (2013.01); *G06F 9/5061* (2013.01); *G06F 9/5077* (2013.01); *H05K 7/20836* (2013.01); *G06F 9/5027* (2013.01); *G06F 9/5044* (2013.01); *G06F 2209/508* (2013.01); *G06F 2209/509* (2013.01)

(58) Field of Classification Search
None
See application file for complete search history.

(56) References Cited

U.S. PATENT DOCUMENTS 11,875,191 B1 * 1/2024 Plenderleith ........ H04W 64/003
2008/0163239 A1 * 7/2008 Sugumar ............. G06F 9/45558 718/105
2011/0173465 A1 * 7/2011 Akers .................. H05K 7/1498 718/1
2012/0030349 A1 * 2/2012 Sugai .................... G06F 9/5077 709/224
2015/0347174 A1 * 12/2015 Song .................. G06F 9/45558 718/1

(Continued)

*Primary Examiner* — Abu Zar Ghaffari
(74) *Attorney, Agent, or Firm* — ANOVA LAW GROUP, PLLC

(57) ABSTRACT

A method includes determining whether an overheated composable resource, which has a corresponding temperature higher than or equal to a first threshold temperature, is in a container of a composable system, and in response to determining that the overheated composable resource is in the container of the composable system: identifying a composable resource having a corresponding temperature lower than or equal to a second threshold temperature as a target composable resource, and mapping the target composable resource to the container to transfer at least part of current workload of the overheated composable resource to the target composable resource. The second threshold temperature is lower than the first threshold temperature. A difference between the first threshold temperature and the second threshold temperature is one-fourth to three-fourth of a difference between the first threshold temperature and a room temperature.

12 Claims, 5 Drawing Sheets

(56) References Cited

U.S. PATENT DOCUMENTS

| | | | | |
|---|---|---|---|---|
| 2016/0054775 | A1* | 2/2016 | Rajappa | G05B 15/02<br>713/320 |
| 2016/0357610 | A1* | 12/2016 | Bartfai-Walcott | G06F 9/5072 |
| 2018/0285009 | A1* | 10/2018 | Guim Bernat | G06F 9/5044 |
| 2018/0356105 | A1* | 12/2018 | Gu | F24D 12/02 |
| 2020/0034171 | A1* | 1/2020 | Kommula | G06F 9/4893 |
| 2020/0179718 | A1* | 6/2020 | Gil | A61N 5/0624 |
| 2020/0379529 | A1* | 12/2020 | Le Goff | G06N 3/0442 |
| 2023/0230194 | A1* | 7/2023 | North | G06F 1/203 |
| 2024/0168817 | A1* | 5/2024 | Bahirat | G06F 9/5072 |
| 2024/0291835 | A1* | 8/2024 | Sethi | H04L 63/1425 |

* cited by examiner

DYNAMIC COMPUTE COMPOSITION WITH WORKLOAD REDISTRIBUTION AMONG MULTIPLE COMPOSABLE RESOURCES OF COMPOSABLE SYSTEM

CROSS-REFERENCE TO RELATED APPLICATION

This application claims priority to Chinese Application No. 202310266536.7, filed on Mar. 14, 2023, the entire content of which is incorporated herein by reference.

FIELD OF THE DISCLOSURE

The present disclosure generally relates to the field of cloud computing and, more particularly, to dynamic compute composition for thermal and energy efficiency optimization.

BACKGROUND

In software-defined infrastructure, centralized composition management software runs an algorithm to provide composable resource management. Existing algorithms make a placement decision at the time of composition. Energy and thermal constraints may be considered at that time, but the existing algorithms fail to recognize the dynamic nature of the shared resource ecosystem. Asynchronous composition requests from other elements in a sharing domain will lead to situations where operation falls out of balance from best practices.

SUMMARY OF THE DISCLOSURE

One aspect of the present disclosure provides a method for dynamic compute composition including determining that a composition condition for a composable system is satisfied; and composing the composable system according to the composition condition to redistribute workloads among two or more composable resources of the composable system.

Another aspect of the present disclosure provides a management controller for dynamic compute composition including a memory storing program instructions, and a processor configured to execute the program instructions to determine that a composition condition for a composable system is satisfied, and compose the composable system according to the composition condition to redistribute workloads among two or more composable resources of the composable system.

Another aspect of the present disclosure provides a composable system including a plurality of composable resources and a management controller. The management controller includes a memory storing program instructions, and a processor configured to execute the program instructions to determine that a composition condition for a composable system is satisfied, and compose the composable system according to the composition condition to redistribute workloads among two or more composable resources of the composable system.

Other aspects of the present disclosure can be understood by those skilled in the art in light of the description, the claims, and the drawings of the present disclosure.

BRIEF DESCRIPTION OF THE DRAWINGS

To more clearly illustrate the technical solution in the present disclosure, the accompanying drawings used in the description of the disclosed embodiments are briefly described hereinafter. The drawings described below are merely some embodiments of the present disclosure. Other drawings may be derived from such drawings by a person with ordinary skill in the art without creative efforts and may be encompassed in the present disclosure.

DETAILED DESCRIPTION

The following describes the technical solutions in the embodiments of the present invention with reference to the accompanying drawings. Wherever possible, the same reference numbers will be used throughout the drawings to refer to the same or like parts. Apparently, the described embodiments are merely some but not all the embodiments of the present invention. Other embodiments obtained by a person skilled in the art based on the embodiments of the present invention without creative efforts shall fall within the scope of the present disclosure.

Figure 1:
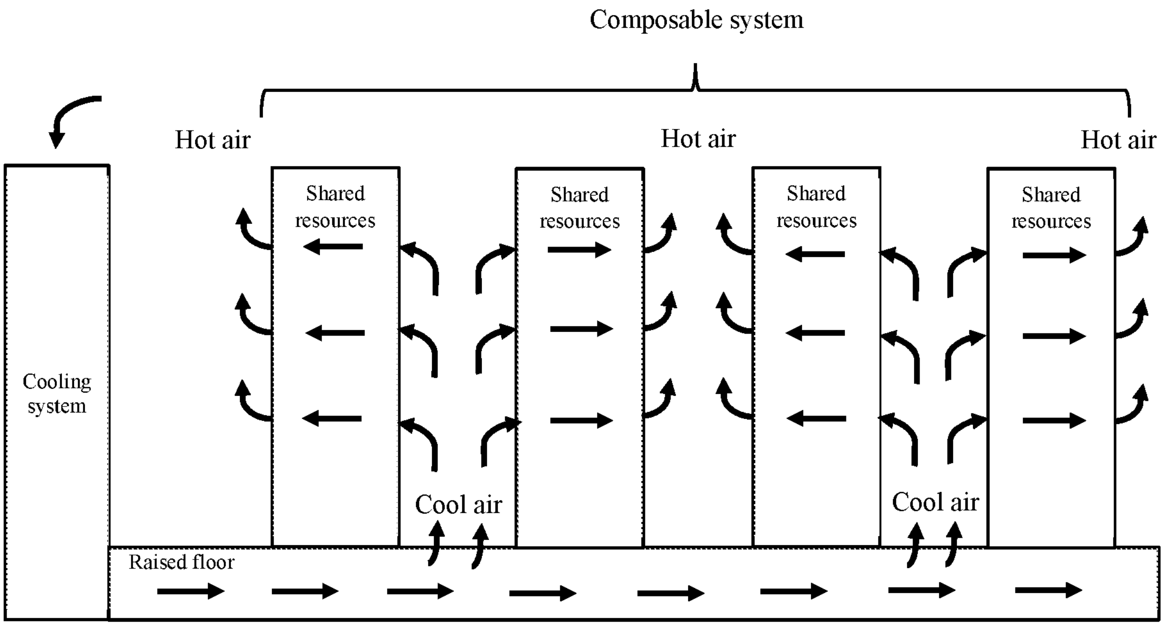
FIG. 1 illustrates a schematic diagram showing an example of cooling a compute system according to some embodiments of the present disclosure.

FIG. 1 illustrates a schematic diagram showing an example of cooling a compute system according to some embodiments of the present disclosure. The compute system can be, e.g., at a data center. As shown in FIG. 1, the compute system includes a plurality of compute resources/compute components such as central processing units (CPUs), graphic processing units (GPUs), field programmable gate arrays (FPGAs), and/or storage devices such as memories. The resources can be packaged in a plurality of chassis and the plurality of chassis can be stacked in one or more racks.

When performing compute tasks, the compute system can generate heat. To keep the compute system running at optimal performances, a cooling system is provided to remove the heat generated by the compute system and hence cool down the compute system. For example, in the example shown in FIG. 1, the cooling system blows cool air upward from underneath a raised floor through perforated floor tiles.

The cooling air may move faster at the bottom of the rack than at the top of the rack. The pressure of the cool air may drop from a location closest to a blower of the cooling system to a location further away from the blower as the cool air is distributed throughout the compute system. In addition, the cool air at the bottom of the rack can absorb heat dissipated by the compute resources while moving upward and turn into the hot air at the top of the rack. The hot air can circulate back to the cooling system. The delivery of the cool air may not be uniform across a rack of the chassis or a row of the racks. Correspondingly, the compute resources in a chassis placed at the top of the rack may not be cooled down as efficiently as the compute resources in a chassis placed at the bottom of the rack.

FIG. 1 only schematically shows an example arrangement of the compute system and the cooling system consistent with embodiments of the disclosure, but does not limit the disclosure. For example, the compute resources of the compute system may not be physically arranged close to each other but may be separately arranged, e.g., in different rooms. As another example, the cool air flow may be in a direction other than the bottom-up direction, e.g., the cooling system may provide the cool air from the top of the racks. Alternatively, the cooling system may use heat pipes to remove the heat from the compute system in addition to circulating the cool air.

According to the disclosure, the compute resources can be grouped as needed and shared by different compute tasks, and hence are also referred to as "shared resources." Grouping and ungrouping of shared resources can be performed on the system control level by mapping and unmapping one or more of the shared resources, as described in more detail below. The process of mapping and unmapping shared resources is also referred to as system composing/recomposing. As such, the compute system can be considered as including a composable compute system (or "composable system" for short) that is capable of being composed/recomposed.

In a composable compute system according to the disclosure, the shared resources are logically grouped together, and each group of such shared resources can correspond to a virtual machine or a container. The shared resources included in the composable compute system are also referred to as "composable resources." In the present disclosure, example embodiments are described in connection with containers, but the same can also be applied to virtual machines.

Composable system management software (or "management software" for short), e.g., a hypervisor, logically provides mapping of the composable resources to various containers running on an operating system. To the operating system, the composable resources appear to be locally installed and are connected through a system bus such as a peripheral component interconnect (PCI) bus, although in reality the composable resources may be connected through communication interfaces such as Ethernet interfaces and/or fiber channel interfaces. The management software can dynamically swap the shared resources in and out of a container by changing the mapping of the physical composable resources. The composable compute system provides the flexibility for matching the compute need of a specific application with the appropriate compute capacity in a container.

Consistent with embodiments of the disclosure, each container may correspond to a group of composable resources including, e.g., one or more CPUs, GPUs, FPGAs, and/or storage devices such as memories, which may or may not be disposed in a same physical chassis or a same physical rack. That is, the group of composable resources are mapped to the container. Hereinafter, for description purposes, a composable resource corresponding to a container is also referred to as the resource being included in the container, and correspondingly a container corresponding to a group of composable resources is also referred to as the container including the group of composable resources.

The management software can assign workload by containers rather than by physical chassis or racks. As such, the composable system management software is able to redistribute the heat dissipation of the composable resources across the compute system. For example, for one container, the corresponding CPU and memory consume 500 watts of energy and dissipate heat correspondingly, and the storage device and the GPU also consume 500 watts of energy and dissipate heat correspondingly. In the composable system, for example, the storage device and the GPU can be located at a rack different from the rack where the CPU and the memory are located or at a different location of the same rack where the CPU and the memory are located.

In some embodiments, the composable resources in the composable system can be dynamically mapped to various containers to optimize thermal and/or energy efficiencies. For example, in response to the temperature rise at a particular location of the rack due to heavy workload, the composable system management software may recompose the corresponding container by removing the composable resource(s) located at the temperature rising location from the group corresponding to the container (unmapping) and including composable resources located at location(s) with more accommodating temperature (mapping), provided that the composable resources located at the location with the more accommodating temperature are available for accepting workload.

The present disclosure provides a method for dynamic compute composition to optimize thermal and energy efficiency of a composable system. The method can be implemented in a management device, e.g., a management controller, which can be, e.g., part of the composable system. Composable system management software for managing the composable system can run on the management device, e.g., the management controller, to implement the method. The composable system includes a plurality of composable resources.

Figure 2:
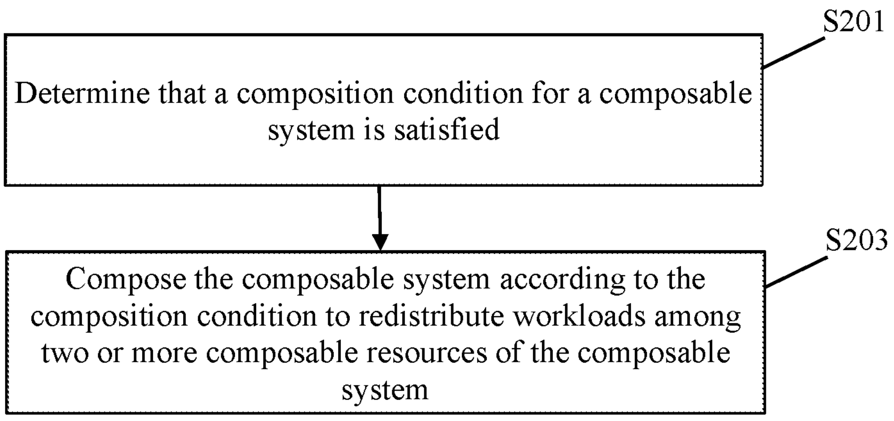
FIG. 2 illustrates a flowchart of an example of a method for dynamic compute composition according to some embodiments of the present disclosure.

FIG. 2 illustrates a flowchart of an example of a method for dynamic compute composition according to some embodiments of the present disclosure. As shown in FIG. 2, at S201, whether a composition condition for a composable system is satisfied is determined.

In some embodiments, the composition condition includes a thermal status of the composable system. For example, the thermal status includes that one or more composable resources are overheated, overloaded, or light-loaded. The overheated or overloaded composable resource causes thermal stress to the composable system and does not operate at an optimal performance. The workload of the light-loaded composable resource can be consolidated to save energy consumption.

At S203, the composable system is composed according to the composition condition to redistribute workloads among two or more composable resources of the composable system.

In some embodiments, after it is determined that the composition condition is satisfied, the composable system is composed according to the composition condition to redistribute the workloads among two or more composable resources of the composable system. For example, the composition condition is about an overheated composable resource. The workload of the overheated composable resource is transferred to a different composable resource that has the same function as the composable resource and has extra capacity to at least partially take over the current workload of the overheated composable resource.

Detailed examples of the method are described below with reference to the drawings. The composition condition according to the disclosure can be, e.g., one of the conditions in processes S301, S401, S501, S601, and S701 described below, and the compute composition (workload redistribution) according to the disclosure can include, e.g., one of the composition manners in processes S303, S405, S505, S603, and S703 described below.

Figure 3:
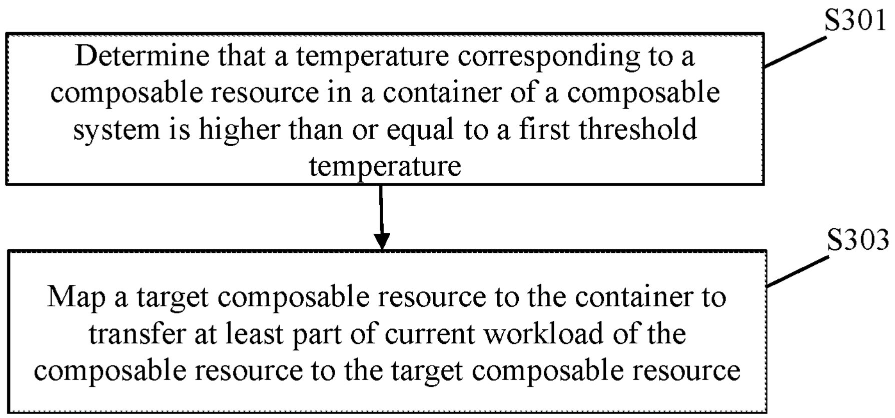
FIG. 3 illustrates a flowchart of another example of a method for dynamic compute composition according to some embodiments of the present disclosure.

FIG. 3 illustrates a flowchart of an example of a method for dynamic compute composition according to some embodiments of the present disclosure. As shown in FIG. 3, at S301, a temperature corresponding to a composable resource in a container of a composable system is determined to be higher than or equal to a first threshold temperature. In this disclosure, the temperature corresponding to a composable resource is also referred to as a "corresponding temperature" of the composable resource, and a composable resource having a corresponding temperature higher than or equal to the first threshold temperature is also referred to as an "overheated composable resource." Thus, at S301, the overheated composable resource is determined.

In some embodiments, a user can configure an inventory of the plurality of composable resources forming the composable system, associate each of the plurality of composable resources to a temperature sensor that monitors a corresponding temperature of the associated composable resource, and store the association between each of the plurality of composable resources and the corresponding temperature sensor in a storage device, such as a memory of the management controller.

In some embodiments, temperature sensors are installed in the composable system to monitor the corresponding temperatures of the composable resources. The corresponding temperature of a composable resource can reflect how effective the cooling system cools the composable resource. In some embodiments, the temperature sensor associated with a composable resource can measure an ambient temperature of an ambiance surrounding or near the composable resource, and the corresponding temperature of the composable resource can be the ambient temperature of the composable resource. For example, the temperature sensor may be an exhaust sensor that senses the temperature of the air leaving the composable resource. As another example, the temperature sensor may be an exhaust sensor that senses the temperature of the air leaving the chassis that contains the composable resource. The temperature measured by the exhaust sensor can represent the temperature in the ambient environment of the composable resource. In some embodiments, the temperature sensor associated with a composable resource can be, e.g., an infrared sensor, and can measure a temperature of the composable resource itself (also referred to as an "intrinsic temperature" of the composable resource) by, e.g., detecting infrared emissions from the composable resource.

The user can also configure, e.g., through the composable system management software, a first threshold temperature for each composable resource of the composable system. Based on the first threshold temperature and the temperature corresponding to the composable resource, whether the composable resource is overheated can be determined. For example, the composable resource can be determined to be overheated if the temperature corresponding to the composable resource, e.g., the ambient temperature or the intrinsic temperature of the composable resource, is higher than or equal to the first threshold temperature.

The first threshold temperature can be a temperature higher than the room temperature (i.e., around 25° C.), such as about 15° C. to about 65° C. higher than the room temperature. For example, the first threshold temperature can be selected from a temperature range from about 40° C. to about 90° C., such as 60° C.

In some embodiments, the first threshold temperature can be different for different composable resources or the same for at least some of the composable resources. For example, the first threshold temperature can be different for different types of composable resources, or be different for composable resources located at different locations, such as different racks or different chassis. In some embodiments, the first threshold temperature can be the same for all composable resources of the composable system and, in such scenario, the first threshold temperature is also referred to as a first threshold temperature of the composable system.

In some embodiments, the corresponding temperatures of the composable resources are measured constantly and thermal statuses of the composable resources are updated accordingly based on the measured temperatures and the first threshold temperatures of the composable resources. The thermal status of a composable resource can indicate whether the composable resource is overheated.

In some embodiments, a temperature sensor can generate an alert when detecting that the corresponding temperature of a composable resource associated with the temperature sensor is higher than or equal to the first threshold temperature. The temperature sensor can send the overheating alert to the management controller to notify the management controller that the associated composable resource is overheated. In some embodiments, the temperature sensors are coupled to a temperature monitoring device and provide measured temperatures to the temperature monitoring device in real time, periodically, or at preset time points. When the temperature monitoring device receives a measured temperature that is higher than or equal to the corresponding first threshold temperature, the temperature monitoring device can generate and send an alert to the management controller. Such an alert sent by the temperature sensor or by the temperature monitoring device is also referred to as an "overheating alert." When the management controller receives the overheating alert, the management controller can determine that the corresponding temperature of the corresponding composable resource is higher than or equal to the first threshold temperature, i.e., the corresponding composable resource is overheated.

In some embodiments, the temperature sensors can send the measured temperatures directly, or indirectly through the temperature monitoring device, to the management controller in real time, periodically, or at preset time points. When the management controller receives a measured temperature that is higher than or equal to the corresponding first threshold temperature, the management controller can determine that the corresponding temperature of the corresponding composable resource is higher than or equal to the first threshold temperature, i.e., the corresponding composable resource is overheated.

At S303, a target composable resource is mapped to the container to transfer at least part of current workload of the composable resource to the target composable resource. As such, the current workload of the composable resource is at least partially offloaded to the target composable resource and a thermal stress caused by the overheated composable resource is removed.

In some embodiments, when determining that the temperature corresponding to the composable resource in the container of the composable system is higher than or equal to the first threshold temperature, the management controller recomposes the composable resources in the container and transfers at least part of the current workload of the composable resource corresponding to the overheating alert to the target composable resource. In some embodiments, the target composable resource is fungible with the overheated composable resource and has extra capacity to run the offloaded workload of the overheated composable resource.

In some embodiments, the offloaded workload of the overheated composable resource may be distributed to one or more target composable resources.

In some cases, removing a portion of the current workload of the overheated composable resource may be enough to reduce the temperature corresponding to the overheated composable resource to be lower than the first threshold temperature. Therefore, in some embodiments, only a portion of the current workload of the overheated composable resource is transferred (offloaded) to the target composable resource. In these embodiments, the overheated composable resource may be not unmapped from the container. That is, after recomposing, the overheated composable resource and the target composable resource can be both in the container.

In some embodiments, the entire current workload of the overheated composable resource is transferred (offloaded) to the target composable resource. In these embodiments, the overheated composable resource may be unmapped from the container.

Figure 4:
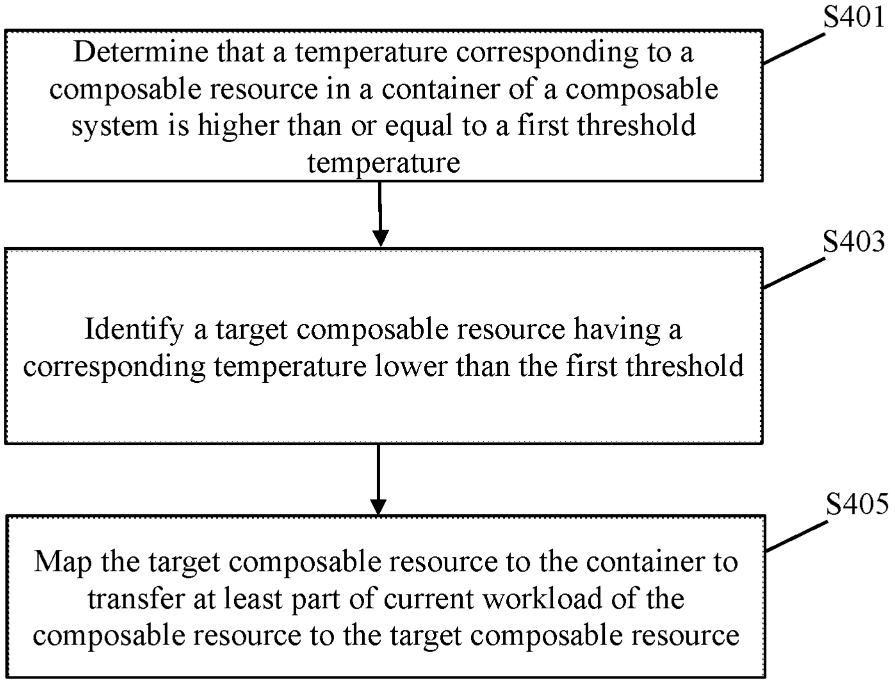
FIG. 4 illustrates a flowchart of another example of a method for dynamic compute composition according to some embodiments of the present disclosure.

FIG. 4 illustrates a flowchart of another example of a method for dynamic compute composition according to some embodiments of the present disclosure. In the method shown in FIGS. 4, S401 and S405 are similar to S301 and S303 of the method shown in FIG. 3, respectively. For the description of S401 and S405, reference can be made to the description of S301 and S303.

As shown in FIG. 4, at S403, a target composable resource having a corresponding temperature lower than the first threshold temperature is identified.

In some embodiments, the target composable resource can be a composable resource that is not overheated, and hence ready to receive extra workload. For example, the temperature corresponding to the target composable resource is lower than the first threshold temperature.

Figure 5:
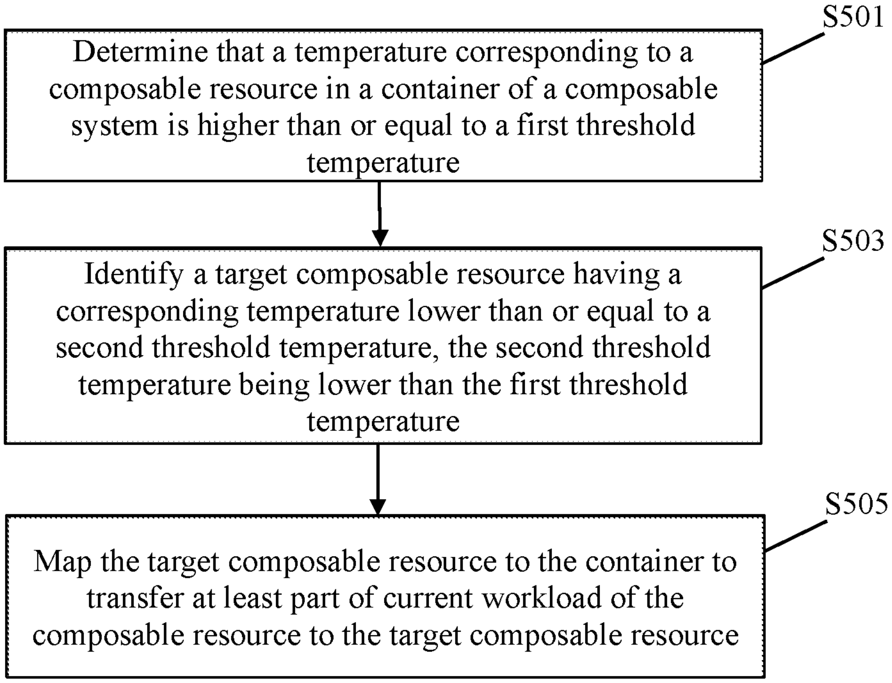
FIG. 5 illustrates a flowchart of another example of a method for dynamic compute composition according to some embodiments of the present disclosure.

FIG. 5 illustrates a flowchart of another example of a method for dynamic compute composition according to some embodiments of the present disclosure. In the method shown in FIGS. 5, S501 and S505 are similar to S301 and S303 shown in FIG. 3. For the description of S501 and S505, reference can be made to the description of S301 and S303.

At S503, a target composable resource having a corresponding temperature lower than or equal to a second threshold temperature is identified. The second threshold temperature is lower than the first threshold temperature.

In some embodiments, the target composable resource can be a composable resource having a corresponding temperature sufficiently under the first threshold temperature, specifically lower than or equal to the second threshold temperature that is lower than the first threshold temperature. As such, the target composable resource can be less likely to become overheated soon after accepting the offloaded workload of the overheated composable resource.

In some embodiments, the second threshold temperature can be the room temperature, or a temperature between the room temperature and the first threshold temperature. For example, the second threshold temperature can be the average of the room temperature and the first threshold temperature, or a difference between the second threshold temperature and the first threshold temperature can be about ¼ to about ¾ of a difference between the room temperature and the first threshold temperature.

Similar to the first threshold temperature, the second threshold temperature can be uniform throughout the composable system (i.e., the composable resources of the composable system have a same second threshold temperature), can be the same for some but not all of the composable resources, or can be different for different composable resources. For example, the second threshold temperature can be different for different types of composable resources, or be different for composable resources located at different locations, such as different racks or different chassis.

Figure 6:
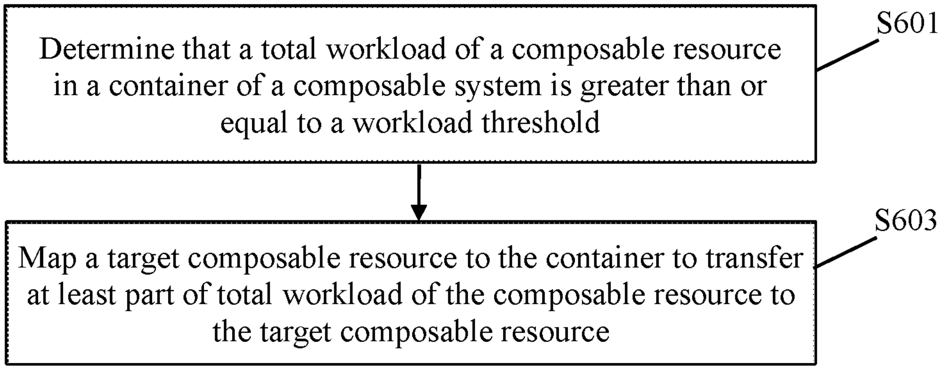
FIG. 6 illustrates a flowchart of another example of a method for dynamic compute composition according to some embodiments of the present disclosure.

FIG. 6 illustrates a flowchart of another example of a method for dynamic compute composition according to some embodiments of the present disclosure. The method shown in FIG. 6 shares a similar operation principle as the method shown in FIG. 3. The difference is that a different thermal metric is used to monitor the thermal stress. In the method shown in FIG. 3, the temperature corresponding to the composable resource is monitored. In the method shown in FIG. 6, the workload of the composable resource is monitored. The workload can be an aggregated measurement of the utilization of the composable resource in the composable system.

The workload can correlate with the thermal stress or the corresponding temperature of the composable resource. When the workload of the composable resource increases, the corresponding temperature of the composable resource may increase correspondingly. When the workload of the composable resource decreases, the ambient temperature of the composable resource may decrease correspondingly. The temperature increasing/decreasing can be instantaneous or after a certain delay. The delay can be caused by, e.g., the heat capacity of the composable resource.

As shown in FIG. 6, at S601, a total workload of a composable resource in a container of a composable system is determined to be greater than or equal to a workload threshold. The workload threshold can be an indirect measure for indicating that the composable resource is overheated or likely will be overheated. That is, once the total workload of a composable resource is greater than or equal to the corresponding workload threshold, the composable resource can be considered as being overheated or as being likely to be overheated. A composable resource in this condition can be referred to as an "overloaded composable resource," or also be referred to as an "overheated composable resource." That is, at S601, the overloaded composable resource (overheated composable resource) is determined.

In some embodiments, the workload threshold of a composable resource can be expressed as a percentage of a maximum workload that the composable resource can handle. Similar to the first threshold temperature and the second threshold temperature described above, the workload threshold (expressed in terms of percentage) can be uniform throughout the composable system (i.e., the composable resources of the composable system have a same workload threshold), can be the same for some but not all of the composable resources, or can be different for different composable resources. For example, the workload threshold can be different for different types of composable resources, or be different for composable resources located at different locations, such as different racks or different chassis.

In some embodiments, a user can configure an inventory of the plurality of composable resources forming the composable system, assign each of the plurality of composable resources a cooling effectiveness parameter associated with a physical location of the composable resource, and store the cooling effectiveness parameter for each of the plurality of composable resources in the management controller of the composable system. As previously described, the cooling system may not cool the composable system uniformly. The cooling effectiveness parameter of the composable resource can reflect the cooling effectiveness at the particular physical location. For example, the cooling effectiveness parameter is 100% if the composable resource is physically located adjacent to the cool air blower of the cooling system, and the cooling effectiveness parameter decreases as the physical location of the composable resource is further away from the cool air blower of the cooling system.

In some embodiments, the user further configures a workload threshold for each composable resource in the composable system based on the cooling effectiveness parameter to avoid overheating the composable resource.

At S603, a target composable resource is mapped to the container to transfer at least part of the total workload of the composable resource to the target composable resource. As such, the total workload of the composable resource is at least partially offloaded to the target composable resource and a thermal stress caused by the overheated composable resource is removed. The process at S603 is similar to that at S303, and hence detailed description thereof is omitted.

In some embodiments, the management controller tracks the current workload of each composable resource in the composable system. The current workloads of all the composable resources in the composable system can reflect the thermal status of the composable system. In some embodiments, the management controller can identify and select a composable resource having a current workload lower than the corresponding workload threshold as the target composable resource, such that the recomposition does not cause the target composable resource to exceed the workload threshold of the target composable resource. As such, the thermal stress to the composable system is avoided.

Figure 7:
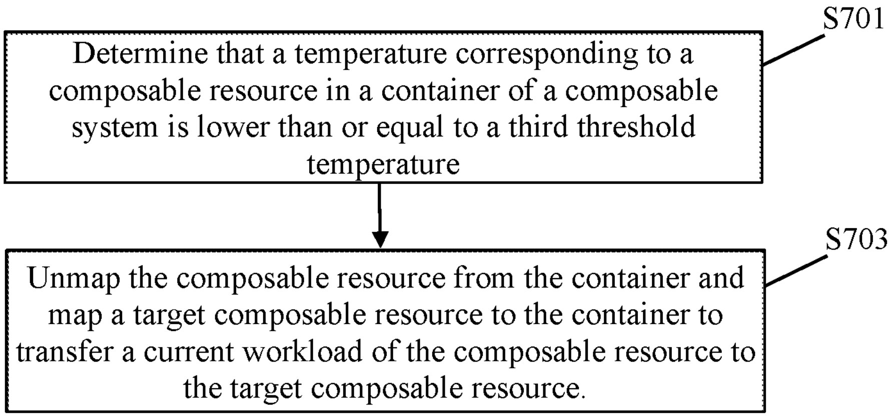
FIG. 7 illustrates a flowchart of another example of a method for dynamic compute composition according to some embodiments of the present disclosure.

FIG. 7 illustrates a flowchart of another example of a method for dynamic compute composition according to some embodiments of the present disclosure. As shown in FIG. 7, at S701, a temperature corresponding to a composable resource in a container of a composable system is determined to be lower than or equal to a third threshold temperature. The determination of the corresponding temperature of a composable resource in S701 of FIG. 7 is similar to the determination of the corresponding temperature of a composable resource in S301 of FIG. 3 described above. The difference between the determination in S701 and the determination in S301 is that the temperature corresponding to the composable resource is compared with different threshold temperatures. The composable resource having a corresponding temperature lower than the third threshold temperature is also referred to as a "light-load composable resource." That is, at S701, the light-load composable resource is determined.

In some embodiments, the third threshold temperature is lower than the first threshold temperature. In some embodiments, the third threshold temperature is lower than both the first threshold temperature and the second threshold temperature. The third threshold temperature is configured to identify a lightly loaded composable resource, such that the current workload of the lightly loaded composable resource can be consolidated and transferred to another composable resource. The consolidation can help to lower the overall energy consumption of the composable system even if the overall workload of the composable system remains the same.

At S703, the light-load composable resource is unmapped from the container and a target composable resource is mapped to the container to transfer a current workload of the light-load composable resource to the target composable resource.

That is, in response to the light-load composable resource being determined, the target composable resource is identified to consolidate the current workloads of the light-load composable resource. The target composable resource may be a similar composable resource that is fungible with the light-load composable resource and has extra capacity to run the current workload of the light-load composable resource. To consolidate the workload of the composable system to fewer composable resources, the management controller can select the target composable resource that has already carried some existing workload and transfer the workload of the light-load composable resource to the light-load composable resource. Because the workload on the light-load composable resource is not heavy, transferring the workload of the light-load composable resource to the target composable resource will not cause the target composable resource to be overheated. Further, after consolidation, the additional energy consumed by the target composable resource to carry the workload of the light-load composable resource is usually less than the energy consumed by the light-load composable resource before consolidation.

In some embodiments, the temperature corresponding to a composable resource being lower than or equal to the third threshold temperature can indicate that the composable resource is a candidate that can be potentially deactivated for energy saving. When the workloads of the composable system are substantially low, the management controller may aggregate the workloads of multiple composable resources to a particular physical location rather than spread the workloads to many physical locations, such that the overall energy consumption of the composable system is minimized.

Figure 8:
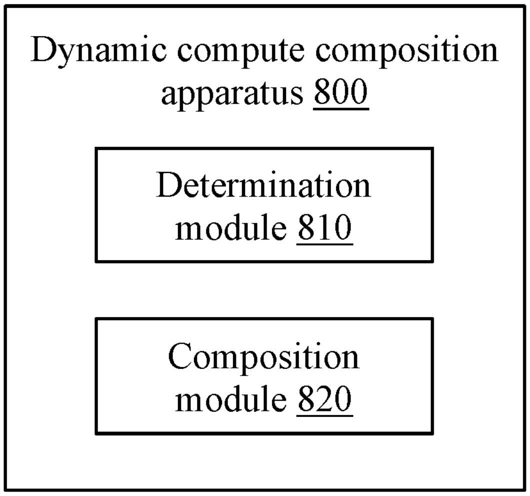
FIG. 8 illustrates a schematic diagram of an example of a dynamic compute composition apparatus according to some embodiments of the present disclosure.

The present disclosure also provides a dynamic compute composition apparatus. FIG. 8 illustrates a schematic diagram of an example of a dynamic compute composition apparatus 800 according to some embodiments of the present disclosure. The dynamic compute composition apparatus 800 can be part of or coupled to a composable system, and be configured to implement a dynamic compute composition method consistent with the disclosure, such as one of the above-described example methods.

As shown in FIG. 8, the dynamic compute composition apparatus 800 includes a determination module 810 configured to determine that a composition condition for the composable system is satisfied and a composition module 820 configured to compose the composable system according to the composition condition to redistribute workloads among two or more composable resources of the composable system.

In some embodiments, the determination module 810 can be configured to determine that a temperature corresponding to a composable resource in a container of a composable system is higher than or equal to a first threshold temperature, and the composition module 820 is configured to map a target composable resource to the container to transfer at least part of current workload of the composable resource to the target composable resource. In these embodiments, the operation principle of the determination module 810 can be similar to the operation principle of the above-described processes S301, S401, and S501 in the example methods for dynamic compute composition, and the detailed description thereof is omitted. Similarly, in these embodiments, the operation principle of the composition module 820 can be similar to the operation principle of the above-described processes S303, S405, and S505 in the example methods for dynamic compute composition, and the detailed description thereof is omitted.

In some embodiments, the dynamic compute composition apparatus 800 further includes an identification module configured to identify the target composable resource. The target composable resource can have the same function as the composable resource and have extra capacity to at least partially take over the current workload of the composable resource. In some embodiments, the temperature corresponding to the target composable resource is lower than the first threshold temperature. In some other embodiments, the temperature corresponding to the target composable resource is lower than or equal to the second threshold temperature. The second threshold temperature is lower than the first threshold temperature.

In some embodiments, the determination module 810 is configured to determine that a total workload of a composable resource in a container of a composable system is greater than or equal to a workload threshold, and the composition module 820 is configured to map a target composable resource to the container to transfer at least part of current workload of the composable resource to the target composable resource. In these embodiments, the operation principle of the determination module 810 can be similar to the operation principle of the above-described process S601 in the example methods for dynamic compute composition, and the detailed description thereof is omitted. Similarly, in these embodiments, the operation principle of the composition module 820 can be similar to the operation principle of the above-described process S603 in the example methods for dynamic compute composition, and the detailed description thereof is omitted.

In some embodiments, the determination module 810 is configured to determine that a temperature corresponding to a light-load composable resource in a container of a composable system is lower than or equal to a third threshold temperature, and the composition module 820 is configured to unmap the light-load composable resource from the container and map a target composable resource to the container to transfer a current workload of the light-load composable resource to the target composable resource. In these embodiments, the operation principle of the determination module 810 can be similar to the operation principle of the above-described process S701 in the example methods for dynamic compute composition, and the detailed description thereof is omitted. Similarly, in these embodiments, the operation principle of the composition module 820 can be similar to the operation principle of the above-described process S703 in the example methods for dynamic compute composition, and the detailed description thereof is omitted.

Figure 9:
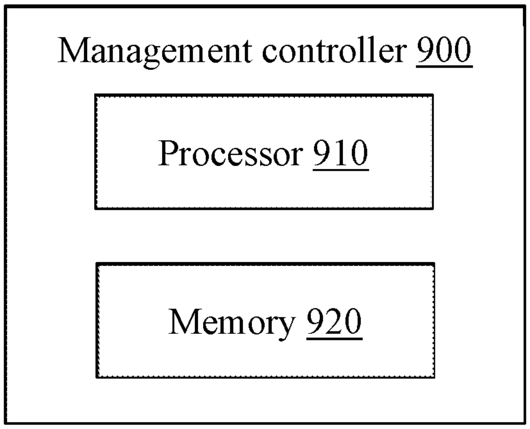
FIG. 9 illustrates a schematic diagram of an example of a management controller according to some embodiments of the present disclosure.

The present disclosure also provides a management controller for dynamic compute composition. FIG. 9 illustrates a schematic diagram of an example of a management controller 900 according to some embodiments of the present disclosure. The management controller can be part of or coupled to a composable system, and be configured to implement a dynamic compute composition method consistent with the disclosure, such as one of the above-described example methods.

As shown in FIG. 9, the management controller 900 includes a processor 910 and a memory 920. The processor 910 can be, for example, a programmable or non-programmable processor (e.g., a central processing unit (CPU), a microprocessor, a field-programmable gate array (FPGA), an application-specific integrated circuit (ASIC), or the like). The memory 920 can include any computer-readable storage medium such as a read-only memory (ROM), a random access memory (RAM), a magnetic disk, an optical disk, or the like.

The memory 910 stores program instructions and the processor 920 executes the program instructions stored in the memory 910 to implement a method for dynamic compute composition consistent with the disclosure, such as one of the above-described example methods. In some embodiments, the processor 920 executes the program instructions stored in the memory 910 to determine that a composition condition for the composable system is satisfied and compose the composable system according to the composition condition to redistribute workloads among two or more composable resources of the composable system.

In some embodiments, the processor 920 executes the program instructions stored in the memory 910 to determine that a temperature corresponding to a composable resource in a container of a composable system is higher than or equal to a first threshold temperature, and map a target composable resource to the container to transfer at least part of current workload of the composable resource to the target composable resource.

In some embodiments, the processor 920 is further configured to execute the program instructions stored in the memory 910 to identify a target composable resource having a corresponding temperature lower than the first threshold temperature.

In some embodiments, the processor 920 is further configured to execute the program instructions stored in the memory 910 to identify a target composable resource having a corresponding temperature lower than or equal to a second threshold temperature. The second threshold temperature is lower than the first threshold temperature.

In some embodiments, the processor 920 is further configured to execute the program instructions stored in the memory 910 to determine that a total load of a composable resource is greater than or equal to a workload threshold, and map a target composable resource to the container of the composable system and assign at least part of the workload to the target composable resource.

In some embodiments, the processor 920 is further configured to execute the program instructions stored in the memory 910 to determine that a temperature corresponding to a composable resource in a container of a composable system is lower than or equal to a third threshold temperature, and unmap the composable resource from the container and map a target composable resource to the container to transfer a current workload of the composable resource to the target composable resource.

The operation principles of the management controller 900 in various embodiments are similar to those in corresponding method embodiments, and hence detailed description thereof is omitted.

Figure 10:
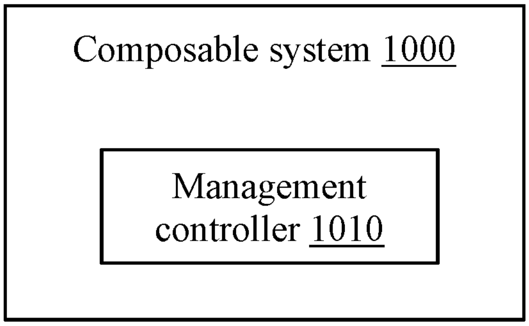
FIG. 10 illustrates a schematic diagram of an example of a composable system according to some embodiments of the present disclosure.

The present disclosure also provides a composable system for dynamic compute composition. FIG. 10 illustrates a schematic diagram of an example of a composable system 1000 according to some embodiments of the present disclosure. As shown in FIG. 10, the composable system includes a management controller 1010 configured to implement a dynamic compute composition method consistent with the disclosure, such as one of the above-described example methods.

The operation principles of the composable system 1000 are similar to those in corresponding method embodiments, and hence detailed description thereof is omitted.

Various embodiments have been described to illustrate the operation principles and exemplary implementations. Those skilled in the art would understand that the present disclosure is not limited to the specific embodiments described herein and that various other obvious changes, rearrangements, and substitutions will occur to those skilled in the art without departing from the scope of the disclosure. A true scope and spirit of the invention is indicated by the following claims.

What is claimed is:

1. A method for dynamic compute composition comprising:

determining whether an overheated composable resource is in a container of a composable system, the overheated composable resource having a corresponding temperature higher than or equal to a first threshold temperature; and in response to determining that the overheated composable resource is in the container of the composable system:

identifying a composable resource having a corresponding temperature lower than or equal to a second threshold temperature as a target composable resource, the second threshold temperature being lower than the first threshold temperature, and a difference between the first threshold temperature and the second threshold temperature being one-fourth to three-fourth of a difference between the first threshold temperature and a room temperature;

mapping the target composable resource to the container to transfer at least part of current workload of the overheated composable resource to the target composable resource; and redistribute workloads of the composable system to the target composable resource.

2. The method according to claim 1, wherein the corresponding temperature of the composable resource in the composable system includes:

an ambient temperature of an ambiance surrounding the composable resource detected by a temperature sensor associated with the composable resource, or an intrinsic temperature of the composable resource detected by an infrared temperature sensor associated with the composable resource.

3. The method according to claim 1, wherein the first threshold temperature is different for different types of composable resources in the composable system.

4. The method according to claim 1, wherein the target composable resource is a first target composable resource, the method further comprising:

determining whether an overloaded composable resource is in the container of the composable system, the overloaded composable resource having a total workload greater than or equal to a workload threshold; and mapping a second target composable resource to the container to transfer at least part of the total workload of the overloaded composable resource to the second target composable resource.

5. The method according to claim 1, wherein the target composable resource is a first target composable resource, the method further comprising:

determining whether a light-load composable resource is in the container of the composable system, the light-load composable resource having a corresponding temperature lower than a threshold temperature; and unmapping the light-load composable resource from the container and mapping a second target composable resource of the composable system other than the light-load composable resource to the container to transfer a current workload of the light-load composable resource to the second target composable resource.

6. The method according to claim 1, wherein each of the overheated composable resource and the target composable resource is a central processing unit, a graphic processing unit, a field programmable gate array, or a storage device that is packaged in one of a plurality of chassis stacked in a rack.

7. A management controller for dynamic compute composition comprising:

a memory storing program instructions; and a processor configured to execute the program instructions to:

determine whether an overheated composable resource is in a container of a composable system, the overheated composable resource having a corresponding temperature higher than or equal to a first threshold temperature; and in response to determining that the overheated composable resource is in the container of the composable system:

identify a composable resource having a corresponding temperature lower than or equal to a second threshold temperature as a target composable resource, the second threshold temperature being lower than the first threshold temperature, and a difference between the first threshold temperature and the second threshold temperature being one-fourth to three-fourth of a difference between the first threshold temperature and a room temperature;

map the target composable resource to the container to transfer at least part of current workload of the overheated composable resource to the target composable resource; and redistribute workloads of the composable system to the target composable resource.

8. The management controller according to claim 7, wherein the corresponding temperature of the composable resource in the composable system includes:

an ambient temperature of an ambiance surrounding the composable resource detected by a temperature sensor associated with the composable resource, or an intrinsic temperature of the composable resource detected by an infrared temperature sensor associated with the composable resource.

9. The management controller according to claim 7, wherein the first threshold temperature is different for different types of composable resources in the composable system.

10. The management controller according to claim 7, wherein:

the target composable resource is a first target composable resource; and the processor is further configured to execute the program instructions to:

determine whether an overloaded composable resource is in the container of the composable system, the overloaded composable resource having a total workload greater than or equal to a workload threshold; and map a second target composable resource to the container to transfer at least part of the total workload of the overloaded composable resource to the second target composable resource.

11. The management controller according to claim 7, wherein:

the target composable resource is a first target composable resource; and the processor is further configured to execute the program instructions to:

determine whether a light-load composable resource is in the container of the composable system, the light-load composable resource having a corresponding temperature lower than a threshold temperature; and unmap the light-load composable resource from the container and map a second target composable resource of the composable system other than the light-load composable resource to the container to transfer a current workload of the light-load composable resource to the second target composable resource.

12. A composable system comprising:

a plurality of composable resources; and a management controller including:

a memory storing program instructions; and a processor configured to execute the program instructions to:

determine whether an overheated composable resource is in a container of a composable system, the overheated composable resource having a corresponding temperature higher than or equal to a first threshold temperature; and in response to determining that the overheated composable resource is in the container of the composable system:

identify a composable resource having a corresponding temperature lower than or equal to a second threshold temperature as a target composable resource, the second threshold temperature being lower than the first threshold temperature, and a difference between the first threshold temperature and the second threshold temperature being one-fourth to three-fourth of a difference between the first threshold temperature and a room temperature;

map the target composable resource to the container to transfer at least part of current workload of the overheated composable resource to the target composable resource; and redistribute workloads of the composable system to the target composable resource.

* * * * *